(12) United States Patent
Ii

(10) Patent No.: US 9,960,751 B2
(45) Date of Patent: May 1, 2018

(54) PIEZOELECTRIC VIBRATOR, ELECTRONIC APPARATUS, AND VEHICLE

(71) Applicant: Seiko Epson Corporation, Tokyo (JP)

(72) Inventor: Toshihiro Ii, Minowa (JP)

(73) Assignee: Seiko Epson Corporation (JP)

( * ) Notice: Subject to any disclaimer, the term of this patent is extended or adjusted under 35 U.S.C. 154(b) by 0 days. days.

(21) Appl. No.: 15/297,474

(22) Filed: Oct. 19, 2016

(65) Prior Publication Data

US 2017/0111027 A1   Apr. 20, 2017

(30) Foreign Application Priority Data

Oct. 20, 2015 (JP) .................. 2015-206141

(51) Int. Cl.
*H03H 9/19* (2006.01)
*H03H 9/13* (2006.01)

(52) U.S. Cl.
CPC ............... *H03H 9/19* (2013.01); *H03H 9/13* (2013.01)

(58) Field of Classification Search
CPC ............ H03H 9/21; H03H 9/215; H03H 9/17; H03H 9/177; H03H 9/19
See application file for complete search history.

(56) References Cited

U.S. PATENT DOCUMENTS

| 4,071,786 A * | 1/1978 | Yamashita | H03H 9/19 310/361 |
| 2007/0053389 A1* | 3/2007 | Sato | H03H 3/02 372/22 |
| 2011/0227457 A1* | 9/2011 | Ishikawa | H03H 3/02 310/344 |
| 2012/0126668 A1 | 5/2012 | Ii et al. | |
| 2012/0229223 A1 | 9/2012 | Ii et al. | |
| 2012/0235762 A1 | 9/2012 | Ii et al. | |
| 2013/0249353 A1 | 9/2013 | Naito et al. | |
| 2015/0255701 A1* | 9/2015 | Kobayashi | H01L 41/053 310/344 |

FOREIGN PATENT DOCUMENTS

| JP | 53-075886 | 7/1978 | |
| JP | 54-094171 U | 7/1979 | |
| JP | 57069921 A * | 4/1982 | H03H 9/19 |
| JP | 60-072409 A | 4/1985 | |

(Continued)

*Primary Examiner* — J. San Martin
(74) *Attorney, Agent, or Firm* — Harness, Dickey & Pierce, P.L.C.

(57) ABSTRACT

A piezoelectric vibrator includes a piezoelectric substrate including a first surface, a second surface that is opposites to the first surface, and a connection part that connects the first surface and the second surface to each other, and a pair of excitation electrodes disposed respectively on the first surface and the second surface. The connection part includes a plurality of protruding parts disposed in an area between the excitation electrode and an outer edge of the piezoelectric substrate. Top parts of the protruding parts are arranged so that the closer to the outer edge the top part is, the closer to the second surface the top part is, and lower parts of the protruding parts adapted to connect the adjacent protruding parts to each other are arranged so that the closer to the outer edge the lower part is, the closer to the second surface the lower part is.

10 Claims, 9 Drawing Sheets

(56) References Cited

FOREIGN PATENT DOCUMENTS

| | | | | |
|---|---|---|---|---|
| JP | 03-049307 A | | 3/1991 | |
| JP | 07-007362 A | | 1/1995 | |
| JP | 10-209786 A | | 8/1998 | |
| JP | 2003-046366 A | | 2/2003 | |
| JP | 2003046366 A | * | 2/2003 | |
| JP | 2007-104042 A | | 4/2007 | |
| JP | 2007-189414 A | | 7/2007 | |
| JP | 2007-189431 A | | 7/2007 | |
| JP | 2011-097623 A | | 5/2011 | |
| JP | 2012-114495 A | | 6/2012 | |
| JP | 2012-114496 A | | 6/2012 | |
| JP | 2012-191299 A | | 10/2012 | |
| JP | 2012-191300 A | | 10/2012 | |
| JP | 2012-199602 A | | 10/2012 | |
| JP | 2012-213017 A | | 11/2012 | |
| JP | 2013-197916 A | | 9/2013 | |
| JP | 2014-123990 A | | 7/2014 | |
| JP | 2014-147091 A | | 8/2014 | |
| JP | 2016140023 A | * | 8/2016 | ........... H03H 9/1021 |
| WO | WO 2016111037 A1 | * | 7/2016 | ............... H03H 9/19 |
| WO | WO 2016121466 A1 | * | 8/2016 | ............... H03H 3/02 |

* cited by examiner

PIEZOELECTRIC VIBRATOR, ELECTRONIC APPARATUS, AND VEHICLE

CROSS-REFERENCE TO RELATED APPLICATION

This application claims priority to Japanese Patent Application No. 2015-206141, filed Oct. 20, 2015, the entirety of which is hereby incorporated by reference.

BACKGROUND

1. Technical Field

The present invention relates to a piezoelectric vibrator, and an electronic apparatus and a vehicle each equipped with the piezoelectric vibrator.

2. Related Art

In the past, there has been known a piezoelectric vibrator characterized in that excitation electrodes are respectively formed in central parts on both principal surfaces of a piezoelectric substrate, a plurality of grooves is disposed between an end in a propagation direction of a thickness-shear vibration and the excitation electrode of the piezoelectric substrate, and the thickness of the plurality of grooves in a thickness direction of the piezoelectric substrate is set so that the closer to the excitation electrode the groove is, the shallower the groove is, and the closer to the end in the longitudinal direction of the piezoelectric substrate the groove is, the deeper the groove is (see, e.g., JP-A-2011-97623, JP-A-2003-46366).

According to the documents, in the piezoelectric vibrator, by efficiently and accurately disposing the plurality of grooves on the piezoelectric substrate, and setting the depth so that the closer to the end in the longitudinal direction of the piezoelectric substrate the groove is, the deeper the groove is, the shape of the piezoelectric substrate approaches in a pseudo manner to a bevel shape (a shape with a tilted peripheral part such as a shape with a chamfered peripheral corner), and a decent energy confinement effect is expected.

However, although in the piezoelectric vibrator, the depths of the grooves gradually ascend from the vibrating region toward the periphery, regarding parts (protruding parts between the grooves) other than the grooves, the positions of the tops (upper surfaces) thereof do not change even in the direction from the vibrating region toward the periphery, and are kept the same as the position of the principal surface of the piezoelectric substrate.

Thus, the shape of the piezoelectric vibrator described above have is similar to the bevel shape with reference to the bottoms of the grooves, but is similar to a flat-plate shape with reference to the tops (upper surfaces) of the protruding parts described above. Therefore, there is a possibility that it is hard to obtain the bevel effect (the energy confinement effect) worth the shape provided with the plurality of grooves.

SUMMARY

An advantage of some aspects of the invention is to solve at least a part of the problems described above, and the invention can be implemented as the following aspects or the application examples.

Application Example 1

A piezoelectric vibrator according to this application example includes a piezoelectric substrate including a first principal surface, a second principal surface forming two sides of the piezoelectric substrate with the first surface, and a connection part adapted to connect the first principal surface and the second principal surface to each other, a pair of excitation electrodes disposed respectively on the first principal surface and the second principal surface, and a plurality of protruding parts disposed in an area between the excitation electrode and an outer edge of the piezoelectric substrate in the connection part, the plurality of protruding parts protrudes toward at least one of the first principal surface and the second principal surface, top parts of the protruding parts are arranged so that the closer to the outer edge the top part is, the closer to the other principal surface on an opposite side to an protruding side the top part is, and lower parts of the protruding parts adapted to connect the adjacent protruding parts to each other are arranged so that the closer to the outer edge the lower part is, the closer to the other principal surface the lower part is.

According to this configuration, in the piezoelectric vibrator, the top parts of the protruding parts disposed in the area between the excitation electrode and the outer edge are arranged so that the closer to the outer edge (closer to the outer edge the protruding part comes), the closer to the other principal surface on the opposite side to the protruding side the top part becomes, and the lower parts adapted to connect the adjacent protruding parts to each other are arranged so that the closer to the outer edge the lower part is, the closer to the other principal surface the lower part becomes.

Thus, in the piezoelectric vibrator, since the shape of the piezoelectric substrate approaches closer to the bevel shape than in the related-art configuration (e.g., JP-A-2011-97623, JP-A-2003-46366), a higher energy confinement effect than ever before can be expected.

Application Example 2

In the piezoelectric vibrator according to the application example described above, it is preferable that in the protruding parts, a width on the top part side is narrower than a width on the lower part side in a cross-section along a direction connecting the excitation electrode and the outer edge to each other.

According to this configuration, in the piezoelectric vibrator, since in the cross-sectional view obtained by cutting the protruding parts along the direction connecting the excitation electrode and the outer edge to each other, the width of the protruding part on the top part side is narrower than that on the lower part side, it results that the shape of the piezoelectric substrate approaches closer to the bevel shape, and thus, the higher energy confinement effect than ever before can be expected.

Application Example 3

In the piezoelectric vibrator according to the application example described above, it is preferable that the protruding part has a spine-like shape in which a thickness on the top part side is thinner than a thickness on the lower part side.

According to this configuration, in the piezoelectric vibrator, since the protruding parts have the spine-like shapes, and the thickness of each of the spine-like shapes on the top part side is thinner than that on the lower part side, it results that the shape of the piezoelectric substrate approaches closer to the bevel shape, and the higher energy confinement effect than ever before can be expected.

Application Example 4

In the piezoelectric vibrator according to the application example described above, it is preferable that a shape, in which the thickness of the piezoelectric substrate gradually decreases in a direction from the protruding part toward the outer edge, is provided between the closest one of the protruding parts to the outer edge and the outer edge.

According to this configuration, since the piezoelectric vibrator has the shape (e.g., a fillet shape), in which the thickness of the piezoelectric substrate gradually decreases in the direction from the protruding part toward the outer edge (as approaching the outer edge from the protruding part), between the closest one of the protruding parts to the outer edge and the outer edge, it becomes harder for the end surface reflection of the vibrational wave to occur compared to the case in which the outer edge part of the piezoelectric substrate is constituted by, for example, a surface perpendicular to the both principal surfaces, and it can be expected to reduce the unwanted vibration component (spurious) such as a contour vibration.

Application Example 5

In the piezoelectric vibrator according to the application example described above, it is preferable that a base substrate on which the piezoelectric substrate is mounted is further included, the piezoelectric substrate is provided with an extraction electrode extending from the excitation electrode so as to cover at least a part of the plurality of protruding parts, and the extraction electrode and the base substrate are fixed with an electrically-conductive adhesive.

According to this configuration, in the piezoelectric vibrator, since the extraction electrode extending from the excitation electrode so as to cover at least a part of the plurality of protruding parts, and the base substrate are fixed to each other with the electrically-conductive adhesive, improvement in fixation strength between the extraction electrode (the piezoelectric substrate) and the base substrate can be expected due to an anchor effect (entanglement effect) of the plurality of protruding parts.

Application Example 6

An electronic apparatus according to this application example includes the piezoelectric vibrator according to any one of the application examples described above.

According to this configuration, since the electronic apparatus is provided with the piezoelectric vibrator according to any one of the application examples described above, it can be expected that the advantages described in any one of the application examples described above are provided, and the excellent performance is exerted.

Application Example 7

A vehicle according to this application example includes the piezoelectric vibrator according to any one of the application examples described above.

According to this configuration, since the vehicle is provided with the piezoelectric vibrator according to any one of the application examples described above, it can be expected that the advantages described in any one of the application examples described above are provided, and the excellent performance is exerted.

BRIEF DESCRIPTION OF THE DRAWINGS

The embodiments of invention will be described with reference to the accompanying drawings, wherein like numbers reference like elements.

DESCRIPTION OF EXEMPLARY EMBODIMENTS

Some embodiments in which the invention is implemented will hereinafter be described with reference to the accompanying drawings.

First Embodiment

Firstly, a quartz crystal vibrator as an example of a piezoelectric vibrator will be described.

Figure 1:
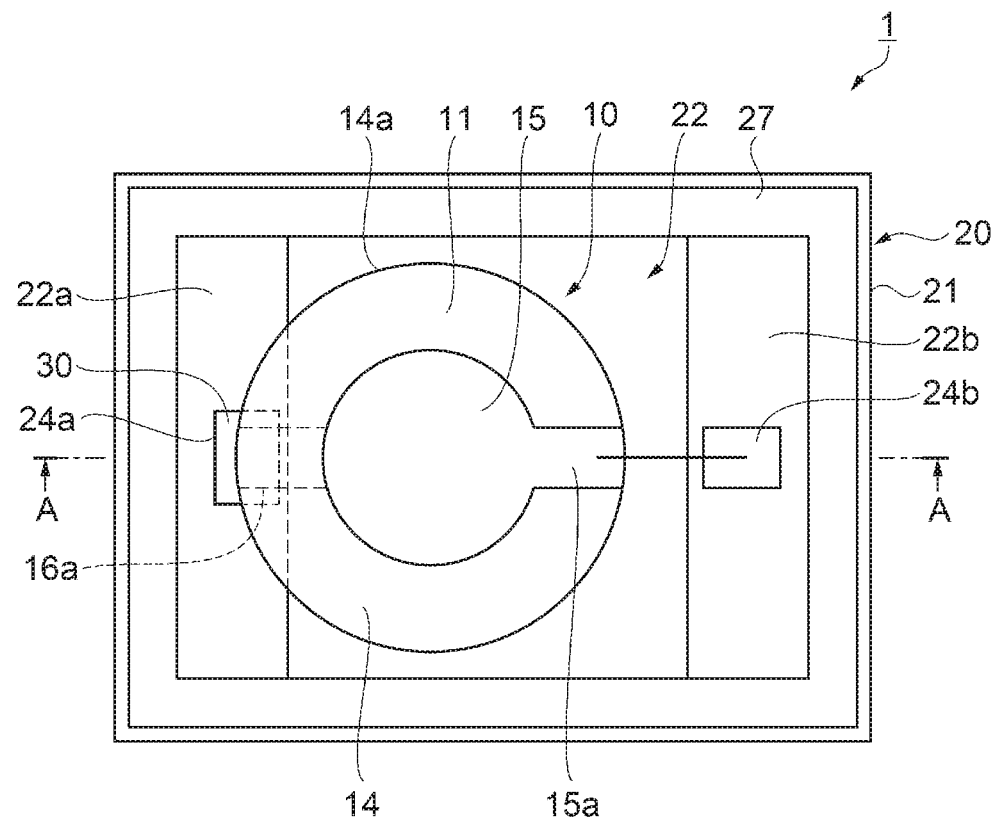
FIG. 1 is a plan view showing a schematic configuration of a quartz crystal vibrator according to a first embodiment of the invention.
Figure 2:
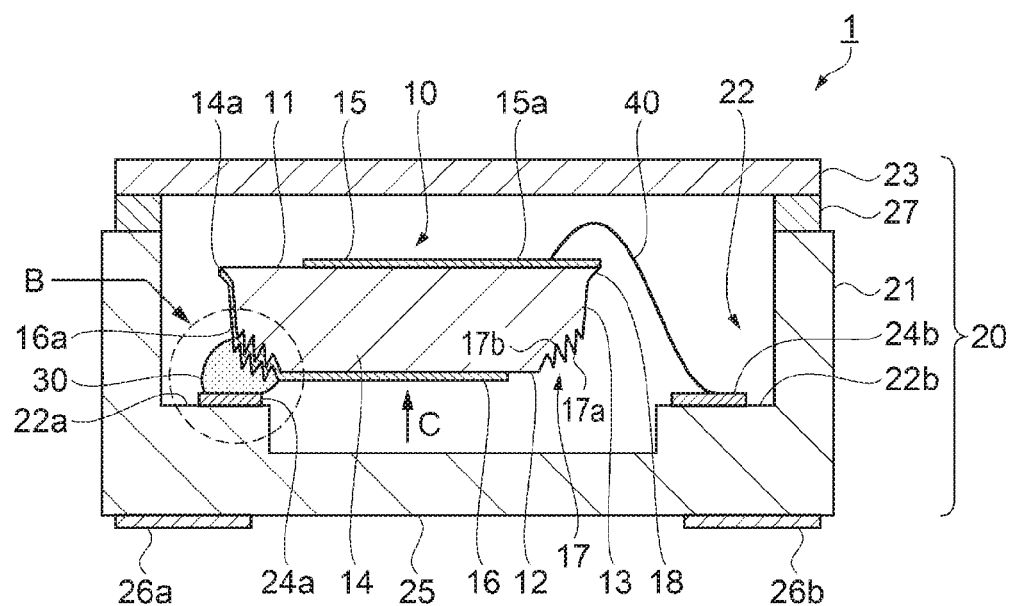
FIG. 2 is a cross-sectional view along the line A-A shown in FIG. 1.
Figure 3:
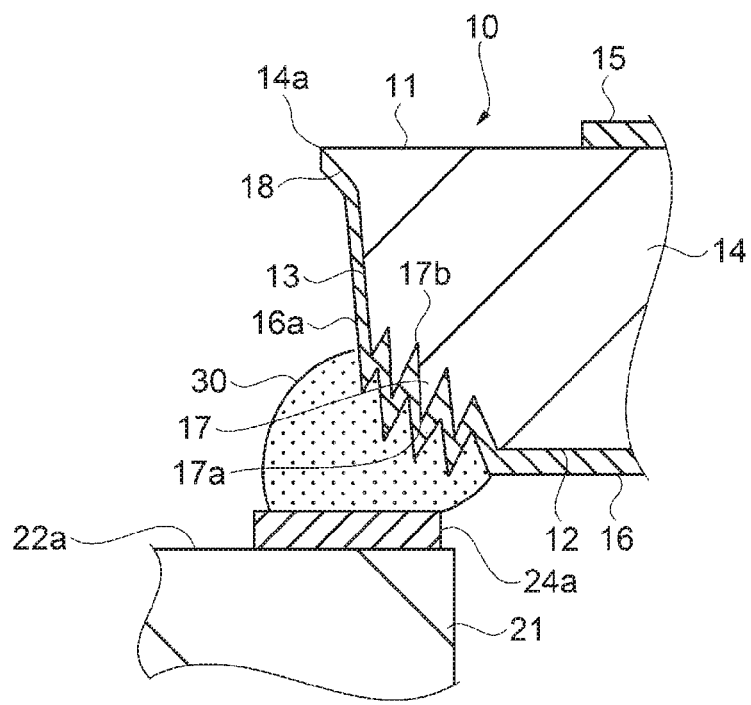
FIG. 3 is an enlarged view of the part B shown in FIG. 2.
Figure 4:
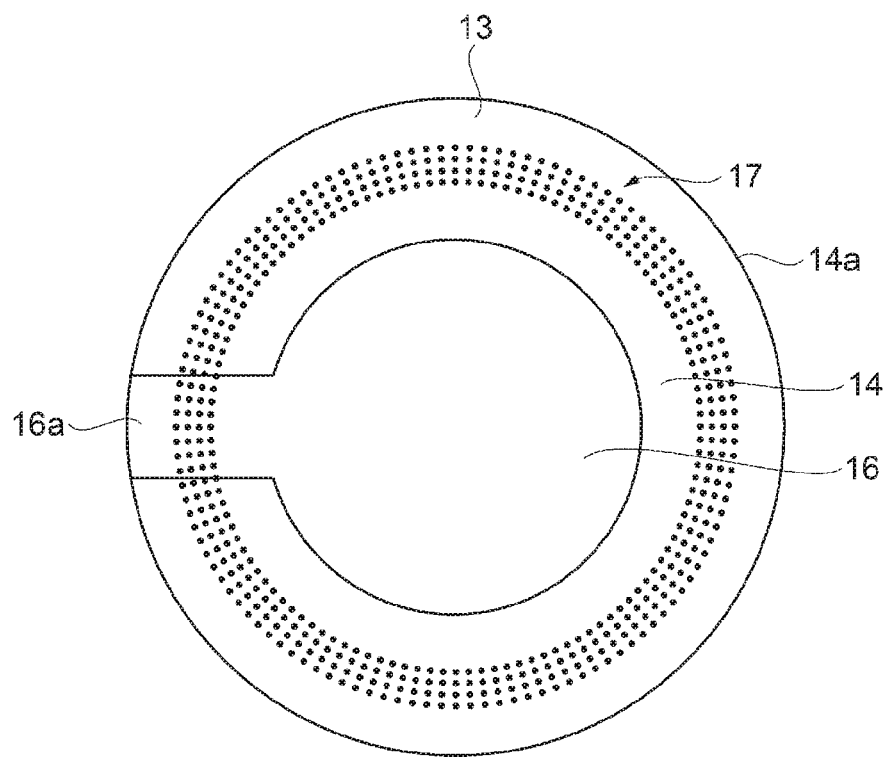
FIG. 4 is a view of FIG. 2 viewed from a direction of the arrow C.

FIG. 1 is a plan view showing a schematic configuration of the quartz crystal vibrator according to a first embodiment. FIG. 2 is a cross-sectional view along the line A-A shown in FIG. 1. FIG. 3 is an enlarged view of the part B shown in FIG. 2. FIG. 4 is a view of FIG. 2 viewed from a direction of the arrow C. It should be noted that some (e.g., a lid) of the constituents are omitted for the sake of convenience. Further, in order to make it easy to understand, the dimensional ratios between the constituents in each of the following drawings including FIG. 1 through FIG. 4 are different from actual ones. Further, in each of the following related drawings including FIG. 1 through FIG. 4, the protruding parts are shown schematically.

As shown in FIG. 1 and FIG. 2, the quartz crystal vibrator 1 according to the first embodiment is provided with a quartz crystal vibrator element 10 having a roughly disk-like shape, and a package 20 having a roughly rectangular solid shape for housing (containing) the quartz crystal vibrator element 10.

The quartz crystal vibrator element 10 is provided with a quartz crystal substrate 14 as a piezoelectric substrate having a first principal surface 11, a second principal surface 12 forming two sides of the quartz crystal substrate 14 with the first principal surface 11, and a connection part 13 for connecting the first principal surface 11 and the second principal surface 12 to each other, excitation electrodes 15, 16 respectively disposed on the first principal surface 11 and the second principal surface 12 of the quartz crystal substrate 14, and a plurality of protruding parts 17 provided to the connection part 13 and disposed between the excitation electrode 16 located on the second principal surface 12 side and the outer edge 14a of the quartz crystal substrate 14.

The quartz crystal substrate 14 is formed to have the roughly disk-like shape by processing a base material (i.e., a base member, a material plate), which has a flat-plate shape and is carved out from a raw stone of a quartz crystal (artificial crystal) or the like at a predetermined angle, using a technology such as dry etching. In the present embodiment, an SC-cut quartz crystal substrate is used as the quartz crystal substrate 14.

The excitation electrodes 15, 16 each have a roughly circular shape in a planar view, and are disposed in a central part of the quartz crystal substrate 14 so as to roughly be concentric with the outer shape of the quartz crystal substrate 14.

As shown in FIG. 2 and FIG. 3, the plurality of protruding parts 17 protrudes on at least one principal surface side (here, the second principal surface 12 side) of the first principal surface 11 and the second principal surface 12.

As shown in FIG. 3, top parts 17a of the respective protruding parts 17 are arranged so that the closer to the outer edge 14a of the quartz crystal substrate 14 the top part 17a is (as the protruding part 17 comes closer to the outer edge 14a), the closer to the other principal surface (here, the first principal surface 11) located on the opposite side to the protruding side the top part 17a is.

Further, lower parts 17b of the protruding parts 17 connecting the adjacent protruding parts 17 to each other are arranged so that the closer to the outer edge 14a of the quartz crystal substrate 14 the lower part 17b is, the closer to the other principal surface (the first principal surface 11) the lower part 17b is.

Further, the plurality of protruding parts 17 is arranged that in a cross-section (here, the cross-section shown in FIG. 2 or FIG. 3) cut along the direction connecting the excitation electrode 16 and the outer edge 14a of the quartz crystal substrate 14 to each other, the width on the top part 17a side is narrower than the width on the lower part 17b side. It should be noted that the cross-section is a plane perpendicular to the second principal surface 12.

Further, as indicated by a plurality of dots in FIG. 4, the protruding parts 17 have spine shapes (in other words, roughly conical shapes, or needle-like shapes) independent of each other, and are provided to the connection part 13 and disposed in a ring-like area from the excitation electrode 16 to the outer edge 14a of the quartz crystal substrate 14.

It should be noted that although in FIG. 4, the plurality of protruding parts 17 is regularly arranged for the sake of convenience of illustration, the protruding parts 17 can also be disposed at random positions.

Each of the spine-like protruding parts 17 is arranged so that the top part 17a side is thinner than the lower part 17b side.

As shown in FIG. 2 through FIG. 4, in the quartz crystal vibrator element 10, the quartz crystal substrate 14 is provided with an extraction electrode 16a disposed so as to extend from the excitation electrode 16 to the outer edge 14a or the front of the outer edge 14a of the quartz crystal substrate 14 so as to cover at least a part the plurality of protruding parts 17.

Further, as shown in FIG. 1 and FIG. 2, in the quartz crystal vibrator element 10, the quartz crystal substrate 14 is provided with an extraction electrode 15a disposed so as to extend from the excitation electrode 15 located on the first principal surface 11 side to the outer edge 14a or the front of the outer edge 14a of the quartz crystal substrate 14.

Further, as shown in FIG. 2 and FIG. 3, the quartz crystal vibrator element 10 has a fillet part 18, which has a shape with the thickness of the quartz crystal substrate 14 gradually decreasing in a direction from the protruding part 17 toward the outer edge 14a (as getting closer to the outer edge 14a from the protruding part 17), between the protruding part 17, which is the closest to the outer edge 14a of the quartz crystal substrate 14, and the outer edge 14a.

Here, an outline of an example of a method of forming the spine-like protruding parts 17 will be described.

Figure 5A:
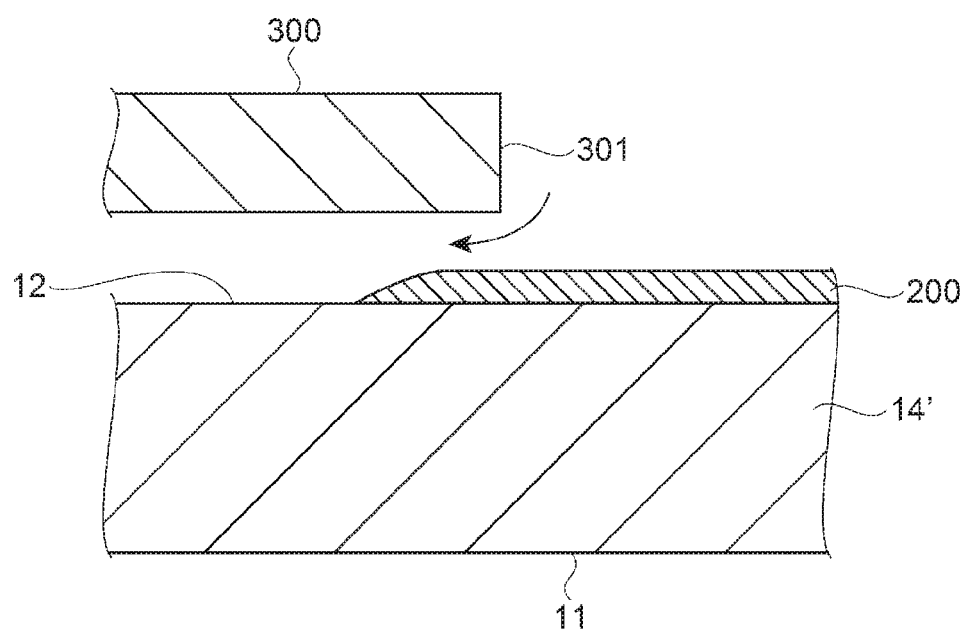
FIG. 5A is a cross-sectional view for explaining an outline of an example of a method of forming spine-like protruding parts.
Figure 5B:
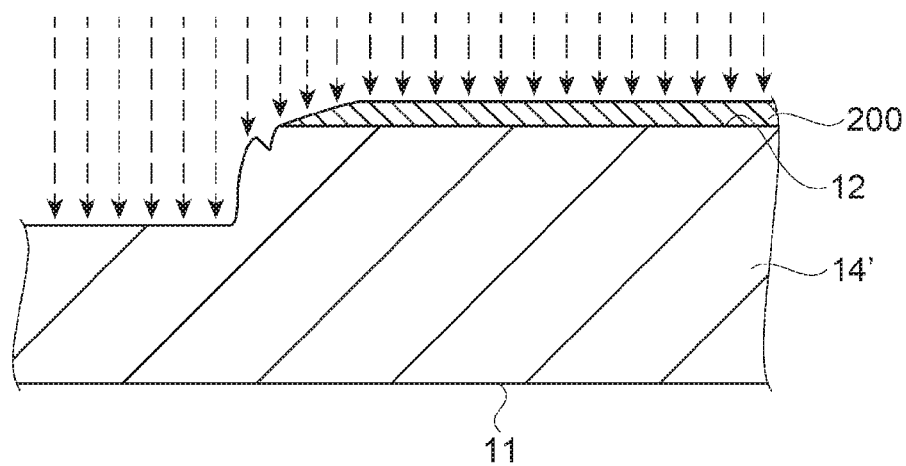
FIG. 5B is a cross-sectional view for explaining the outline of the example of the method of forming the spine-like protruding parts.
Figure 5C:
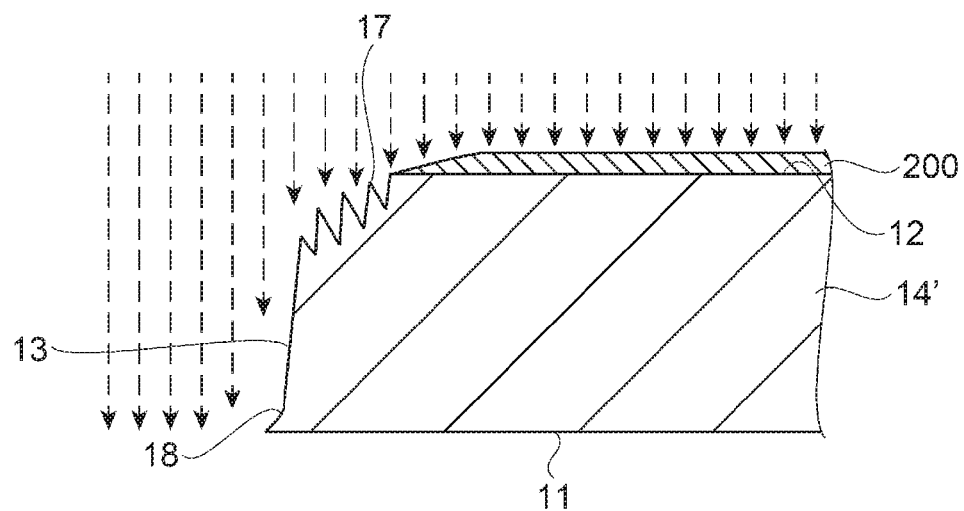
FIG. 5C is a cross-sectional view for explaining the outline of the example of the method of forming the spine-like protruding parts.

FIG. 5A through FIG. 5C are cross-sectional views for explaining the outline of the example of the method of forming the spine-like protruding parts.

As shown in FIG. 5A, as an example of the method of forming the spine-like protruding parts, firstly a corrosion resistant film 200 for forming the disk-like outer shape of the quartz crystal substrate 14 is formed on the second principal surface 12 of the base material 14', which has a flat-plate shape, and turns to the quartz crystal substrate 14 later, using a sputtering process.

On this occasion, a space having a predetermined length is provided between a mask 300 for forming the corrosion resistant film 200 and the second principal surface 12. Thus, the corrosion resistant film 200 is formed so that the thickness of the peripheral part gradually decreases in the direction toward the outer edge using a wrap-around phenomenon of particles (atoms) having been flicked out from the target material from an opening part 301 of the mask 300 as indicated by the arrow.

It should be noted that although the material of the corrosion resistant film 200 is not particularly limited, it is preferable to include chromium (Cr) or nickel (Ni) (to include a Cr alloy or an Ni alloy instead of the Cr simple substance or the Ni simple substance) from a viewpoint of adhesion to the quartz crystal and dry etching selectivity, and so on. As other materials, there can be cited a simple substance of tungsten (W), titanium (Ti), or the like, or an alloy including any of these simple substances.

Further, in order to avoid etching of the corrosion resistant film 200 itself, it is also possible to stack a resist or metal hard mask on the flat part in the center of the corrosion resistant film 200.

Then, as shown in FIG. 5B and FIG. 5C, the base material 14' is dry-etched together with the corrosion resistant film 200 using dry-etching equipment not shown. Thus, a part, which turns to the connection part 13 of the quartz crystal substrate 14 later, is formed to have a shape (roughly curved shape) reflecting (transferring) the shape of the peripheral part of the corrosion resistant film 200.

On this occasion, by adjusting, for example, the dry etching selectivity between the corrosion resistant film 200 and the base material 14', a variation of the film thickness of the peripheral part of the corrosion resistant film 200, a variation of the etching rate, and deviation of the processing due to the deviation of the collision angle of ions of the etch gas, the plurality of spine-like protruding parts 17 is formed.

It should be noted that the etch gas used for the dry etching process is not particularly limited, but there can be cited a fluorinated simple gas such as $CF_4$, $C_4F_8$, $CHF_3$, $CH_2F_2$, $C_2F_6$, $C_3F_8$, $C_4F_6$, $C_5F_8$, $SF_6$, or $NF_3$ or a mixture gas including a noble gas such as argon (Ar) in addition to any one of these simple gases.

It should be noted that the fillet part 18 can be formed to have a desired shape by appropriately setting the concentration of the etch gas, a bias voltage (an applied voltage) of the dry etching, and so on.

The excitation electrodes 15, 16 and the extraction electrodes 15a, 16a of the quartz crystal vibrator element 10 are each formed of a metallic coating having a configuration in which, for example, Cr is used as the foundation layer, and a layer including gold (Au) is stacked on the foundation layer using a vapor deposition process or a sputtering process.

Going back to FIG. 1 and FIG. 2, the package 20 is provided with a package base 21 as a base substrate having a roughly rectangular planar shape, provided with a recessed part 22, and having the quartz crystal substrate 14 (the quartz crystal vibrator element 10) mounted (housed) in the recessed part 22, and a lid 23 having a roughly rectangular plate-like shape covering the recessed part 22 of the package base 21.

A ceramics insulating material such as an aluminum oxide sintered body obtained by molding and then calcining a ceramic green sheet, a mullite sintered body, an aluminum nitride sintered body, a silicon carbide sintered body, or a glass ceramics sintered body, a quartz crystal, glass, silicon (high-resistivity silicon), or the like is used for the package base 21.

As the lid 23, there is used the same material as that of the package base 21, or metal such as Kovar or 42-alloy.

On a stepped part 22a disposed in an end part located on the left side of the sheet of the drawing in the recessed part 22 of the package base 21, there is disposed an internal terminal 24a at a position opposed to the extraction electrode 16a of the quartz crystal vibrator element 10.

On a stepped part 22b disposed in an end part located on the right side of the sheet of the drawing in the recessed part 22 of the package base 21, there is disposed an internal terminal 24b at a position overlapping an imaginary shape obtained by extending the extraction electrode 15a of the quartz crystal vibrator element 10 in a planar view.

In the quartz crystal vibrator 1, the extraction electrode 16a of the quartz crystal vibrator element 10 and the internal terminal 24a of the package base 21 are fixed to each other with an electrically-conductive adhesive 30. In other words, it results that in the quartz crystal vibrator 1, the quartz crystal substrate 14 and the package base 21 are fixed to each other with the electrically-conductive adhesive 30.

The electrically-conductive adhesive 30 is not particularly limited, but there can be cited a material obtained by forming particles of metal including Au, Ag (silver), Cu (copper), Al (aluminum), Ni, or the like as a principal component, or an electrically-conductive material including C (carbon) or the like, and then mixing the particles with resin such as epoxy based resin, silicone based resin, or polyimide based resin.

In the quartz crystal vibrator 1, the extraction electrode 15a of the quartz crystal vibrator element 10 and the internal terminal 24b of the package base 21 are connected to each other with a bonding wire 40 made of Au, Al, or the like. According to the above, in the quartz crystal vibrator 1, the excitation electrodes 15, 16 are electrically connected to the internal terminals 24a, 24b via the extraction electrodes 15a, 16a, respectively.

In both end parts in the horizontal direction of the sheet of the drawing on an outer bottom surface 25 (an external bottom surface) on the opposite side to the recessed part 22 of the package base 21, there are respectively disposed external terminals 26a, 26b each having a rectangular shape.

The external terminals 26a, 26b are connected respectively to the internal terminals 24a, 24b with internal interconnections not shown. In detail, the external terminal 26a is electrically connected to the internal terminal 24a, and the external terminal 26b is electrically connected to the internal terminal 24b.

It should be noted that the internal terminals 24a, 24b, the external terminals 26a, 26b are each formed of a metal coating obtained by stacking coating films made of Ni, Au, or the like on the metalization layer made of, for example, W or molybdenum (Mo) by plating or the like.

In the quartz crystal vibrator 1, in the condition in which the quartz crystal vibrator element 10 is mounted in the recessed part 22 of the package base 21, the recessed part 22 of the package base 21 is covered by the lid 23, and the package base 21 and the lid 23 are bonded to each other with a bonding member 27 such as a seam ring, low-melting-point glass, or an adhesive to thereby airtightly seal the recessed part 22 of the package 21.

It should be noted that the inside of the recessed part 22, which is sealed airtightly, of the package base 21 is in a reduced pressure vacuum state (a state with a high degree of vacuum), or a state of being filled with an inert gas such as $N_2$ (nitrogen), Ar, or He (helium).

It should be noted that the package 20 can be constitute by the package base 21 having a flat-plate shape and the lid 23 having a recessed part. Further, in the package 20, it is also possible to provide recessed parts to both of the package base 21 and the lid 23, respectively.

The thickness-shear vibration is excited in the quartz crystal vibrator element 10 due to the drive signal applied from, for example, an oscillation circuit integrated in an IC chip of an electronic apparatus, on which the quartz crystal vibrator 1 is mounted, via the external terminals 26a, 26b to make the quartz crystal vibrator element 10 resonate (oscillate) at a predetermined frequency, and thus, the quartz crystal vibrator 1 outputs a resonance signal (an oscillation signal) through the external terminals 26a, 26b.

As described above, in the quartz crystal vibrator 1 according to the first embodiment, the top parts 17a the respective protruding parts 17 disposed on the connection part 13 in the area between the excitation electrode 16 and the outer edge 14a of the quartz crystal substrate 14 are arranged so that the closer to the outer edge 14a the top part 17a is, the closer to the other principal surface (here, the first principal surface 11) located on the opposite side to the protruding side (here, the second principal 12 side) the top part 17a is, and the lower parts 17b each connecting the adjacent protruding parts 17 to each other are arranged so that the closer to the outer edge 14a the lower part 17b is, the closer to the other principal surface (the first principal surface 11) the lower part 17b is.

Thus, since the shape of the quartz crystal substrate 14 approaches closer to the bevel shape compared to the related-art configurations (e.g., JP-A-2011-97623, JP-A-2003-46366), the quartz crystal vibrator 1 can be expected to have a higher energy confinement effect than ever before (e.g., an unwanted vibration mode with a short wavelength such as the high-order flexure is suppressed, and thus lowering of the CI value is expected).

Further, in the quartz crystal vibrator 1, since in the cross-sectional view (the cross-sectional views shown in FIG. 2 and FIG. 3) obtained by cutting the protruding parts 17 along the direction connecting the excitation electrode 16 and the outer edge 14a to each other, the width of the protruding part 17 on the top part 17a side is narrower than that on the lower part 17b side, it results that the shape of the quartz crystal substrate 14 approaches closer to the bevel shape, and thus, the higher energy confinement effect than ever before can be expected.

It should be noted that the quartz crystal vibrator 1 can also be formed so that the width of the protruding part 17 on the lower part 17b side and that on the top part 17a side are roughly equal to each other.

Further, in the quartz crystal vibrator 1, since the protruding parts 17 have the spine-like shapes independent of each other, and the thickness of each of the spine-like shapes on the top part 17a side is thinner than that on the lower part 17b side, it results that the shape of the quartz crystal substrate 14 approaches closer to the bevel shape, and the higher energy confinement effect than ever before can be expected.

It should be noted that in the quartz crystal vibrator 1, it is also possible that the plurality of protruding parts 17 is formed to have a ridge-like shape, and the plurality of ridge-like protruding parts 17 is formed roughly concentrically so as to surround the excitation electrode 16.

Further, the quartz crystal vibrator 1 has the fillet part 18, which has the shape with the thickness of the quartz crystal substrate 14 gradually decreasing in the direction from the protruding part 17 toward the outer edge 14a, disposed between the protruding part 17 closest to the outer edge 14a and the outer edge 14a.

According to the fact described above, in the quartz crystal vibrator 1, the end surface reflection of the vibrational wave becomes harder to occur compared to the configuration in which, for example, the outer edge 14a part of the quartz crystal substrate 14 is formed of a plane perpendicular to the both principal surfaces (11, 12), it can be expected to reduce an unwanted vibration component (spurious) such as a contour vibration.

It should be noted that the fillet part 18 can be eliminated from the quartz crystal vibrator 1.

Further, in the quartz crystal vibrator 1, since the extraction electrode 16a extending from the excitation electrode 16 so as to cover at least a part of the plurality of protruding parts 17, and the internal terminal 24a of the package base 21 are fixed with the electrically-conductive adhesive 30, improvement in fixation strength between the extraction electrode 16a (the quartz crystal substrate 14) and the package base 21 can be expected due to an anchor effect (entanglement effect) of the plurality of protruding parts 17.

Further, in the quartz crystal vibrator 1, since the quartz crystal vibrator element 10 is fixed to the package base 21 at a single place, the thermal stress occurring due to the difference in thermal expansion coefficient between the quartz crystal substrate 14 and the package base 21 can further be reduced compared to the case in which the quartz crystal vibrator element 10 is fixed to the package base at two places as in second and third embodiments described later.

Second Embodiment

Then, the quartz crystal vibrator having another configuration will be described.

Figure 6:
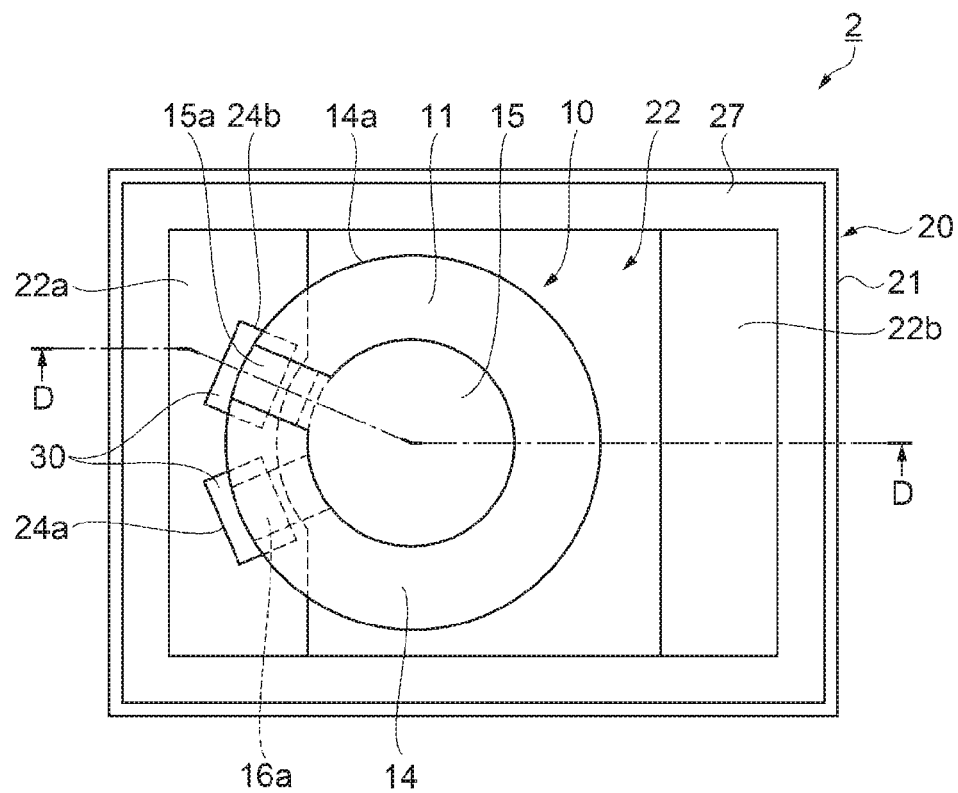
FIG. 6 is a plan view showing a schematic configuration of a quartz crystal vibrator according to a second embodiment of the invention.
Figure 7:
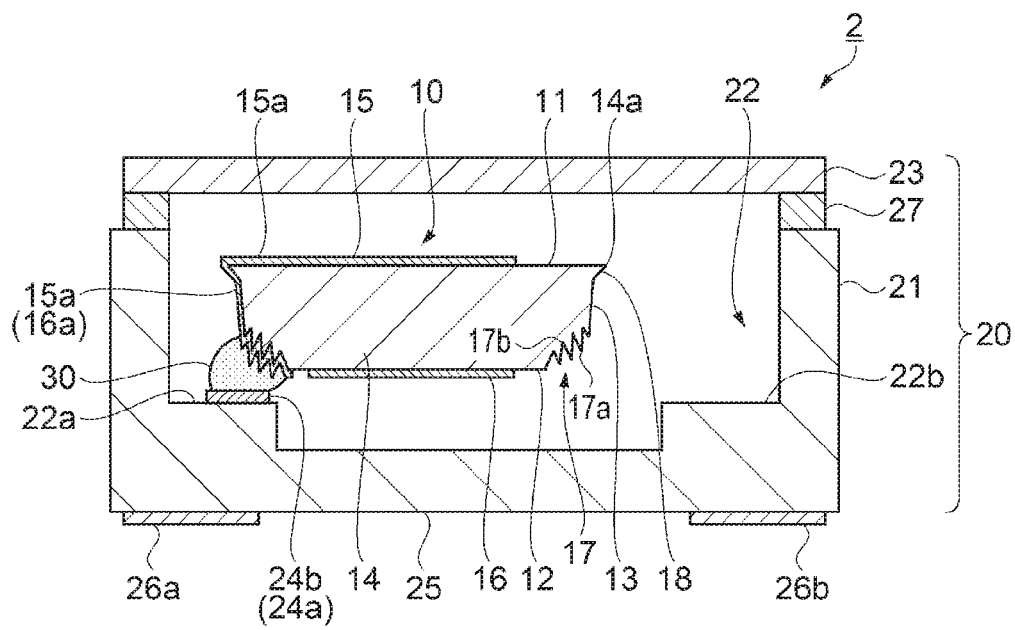
FIG. 7 is a cross-sectional view along the line D-D shown in FIG. 6.

FIG. 6 is a plan view showing a schematic configuration of the quartz crystal vibrator according to a second embodiment. FIG. 7 is a cross-sectional view along the line D-D shown in FIG. 6. It should be noted that the sections common to the first embodiment and the second embodiment are denoted by the same reference numerals, and the detailed explanation thereof will be omitted, while the parts different from those of the first embodiment will mainly be described.

As shown in FIG. 6 and FIG. 7, quartz crystal vibrator 2 according to the second embodiment is different in the configuration of the connection part between the extraction electrode 15a and the internal terminal 24b compared to the first embodiment.

In the quartz crystal vibrator 2, the extraction electrode 15a is extracted from the excitation electrode 15 in roughly the same direction as the extraction electrode 16a, and then extends to the front of the excitation electrode 16 so as to be wrapped from the first principal surface 11 to the connection part 13 and cover at least a part of the plurality of protruding parts 17.

The step part 22a in the recessed part 22 of the package base 21, there is disposed the internal terminal 24b at a position opposed to the extraction electrode 15a of the quartz crystal vibrator element 10 so as to be adjacent to the internal terminal 24a.

In the quartz crystal vibrator 2, the extraction electrode 15a of the quartz crystal vibrator element 10 and the internal terminal 24b of the package base 21 are fixed to each other with the electrically-conductive adhesive 30 similarly to the extraction electrode 16a and the internal terminal 24a.

As described above, in the quartz crystal vibrator 2 according to the second embodiment, the extraction electrode 15a and the internal terminal 24b of the package base 21 are fixed to each other with the electrically-conductive adhesive 30 similarly to the extraction electrode 16a and the internal terminal 24a.

Thus, in the quartz crystal vibrator 2, since the electrical connection between the extraction electrodes 15a, 16a and the internal terminals 24a, 24b can be achieved in a lump by the electrically-conductive adhesive 30, the productivity can be improved compared to the first embodiment.

Third Embodiment

Then, the quartz crystal vibrator having another configuration will be described.

Figure 8:
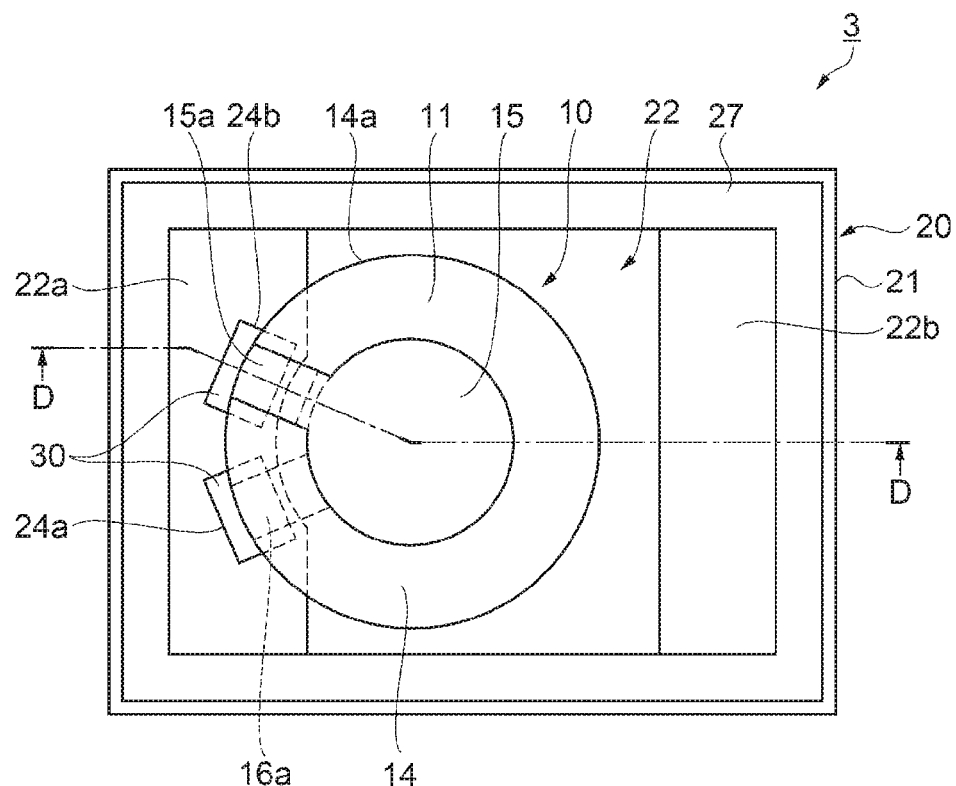
FIG. 8 is a plan view showing a schematic configuration of a quartz crystal vibrator according to a third embodiment of the invention.
Figure 9:
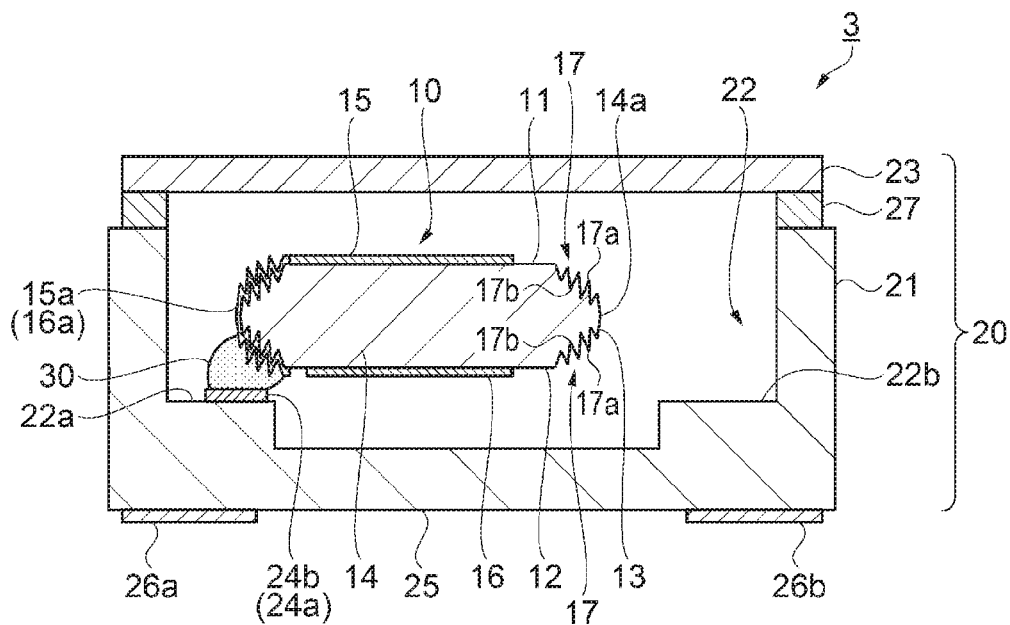
FIG. 9 is a cross-sectional view along the line D-D shown in FIG. 8.

FIG. 8 is a plan view showing a schematic configuration of the quartz crystal vibrator according to a third embodiment. FIG. 9 is a cross-sectional view along the line D-D shown in FIG. 8. It should be noted that the sections common to the first and second embodiments and the third embodiment are denoted by the same reference numerals, and the detailed explanation thereof will be omitted, while the parts different from those of the first and second embodiments will mainly be described. It should be noted that the protruding parts are omitted in FIG. 8.

As shown in FIG. 8 and FIG. 9, unlike the first and second embodiments, in the quartz crystal vibrator 3 according to the third embodiment, the plurality of protruding parts 17 is disposed so as to protrude on both of the first principal surface 11 side and the second principal surface 12 side.

In the quartz crystal vibrator 3, the top parts 17a of the protruding parts 17 protruding on the first principal surface 11 side are arranged so that the closer to the outer edge 14a the top part 17a is, the closer to the other principal surface (the second principal surface 12) located on the opposite side to the protruding side the top part 17a is, and the lower parts 17b each connecting the adjacent protruding parts 17 to each other are arranged so that the closer to the outer edge 14a the lower part 17b is, the closer to the other principal surface (the second principal surface 12) the lower part 17b is.

In the plurality of protruding parts 17 protruding on the second principal surface 12 side, the top parts 17a and the lower parts 17b are arranged so that the closer to the outer edge 14a the top part 17a and the lower part 17b are, the closer to the other principal surface (the first principal surface 11) the top part 17a and the lower part 17b are, similarly to the first and second embodiments.

As described above, in the quartz crystal vibrator 3 according to the third embodiment the plurality of protruding parts 17 is disposed so as to protrude on both of the first principal surface 11 side and the second principal surface 12 side, and the top parts 17a and the lower parts 17b are arranged so that the closer to the outer edge 14a the top part 17a and the lower part 17b are, the closer to the other principal surface the top part 17a and the lower part 17b are.

Thus, in the quartz crystal vibrator 3, since the shapes of the quartz crystal substrate 14 on both principal surface sides approach the bevel shape, the higher energy confinement effect than in the first and second embodiments can be expected.

It should be noted that although in each of the embodiments, it is assumed that the material of the piezoelectric substrate is the quartz crystal, this is not a limitation, and there can also be adopted a piezoelectric material such as lithium tantalate ($LiTaO_3$), lithium tetraborate ($Li_2B_4O_7$), lithium niobate ($LiNbO_3$), lead zirconium titanate (PZT), zinc oxide (ZnO), or aluminum nitride (AlN).

Further, although in each of the embodiments, it is assumed that the SC-cut type is adopted as the quartz crystal substrate, this is not a limitation, and there can also be adopted the AT-cut type, a tuning fork type, a double tuning fork type, an H type, a double-T type, and so on. According to the above, the quartz crystal vibrator can exert an excellent performance as a reference clock oscillation source, or a sensor element of a variety of types of sensors such as an angular velocity sensor, an acceleration sensor, or a pressure sensor.

Electronic Apparatus

Then, an electronic apparatus equipped with the piezoelectric vibrator described above will be described.

Figure 10:
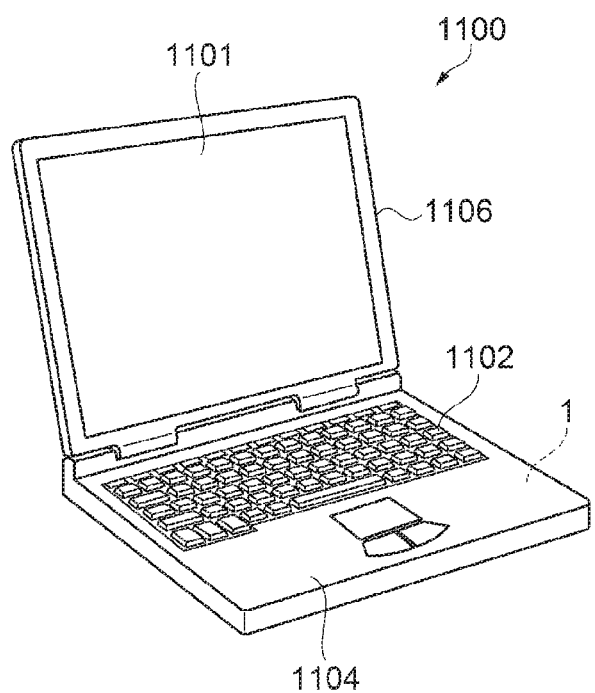
FIG. 10 is a perspective view showing a configuration of a mobile type (or laptop type) personal computer as an electronic apparatus equipped with the piezoelectric vibrator according to the invention.

FIG. 10 is a perspective view showing a configuration of a mobile type (or a laptop type) personal computer as an electronic apparatus equipped with the piezoelectric vibrator.

As shown in FIG. 10, the personal computer 1100 is composed of a main body 1104 equipped with a keyboard 1102, and a display unit 1106 equipped with a display 1101, and the display unit 1106 is pivotally supported with respect to the main body 1104 via a hinge structure.

Such a personal computer 1100 incorporates either of the piezoelectric vibrators described above (here, the quartz crystal vibrator 1 as an example).

Figure 11:
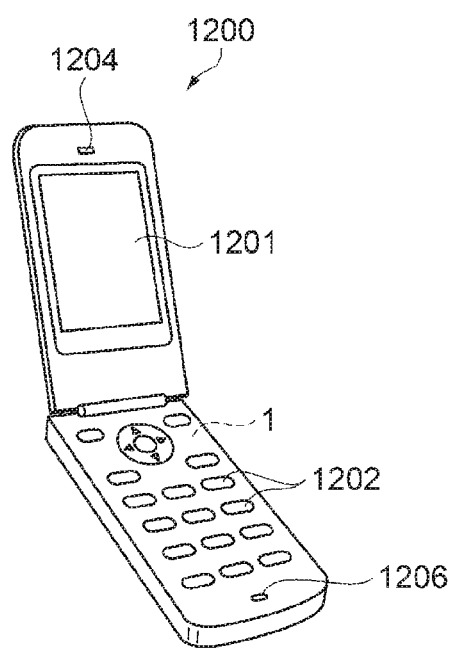
FIG. 11 is a perspective view showing a configuration of a cellular phone (including PHS) as an electronic apparatus equipped with the piezoelectric vibrator according to the invention.

FIG. 11 is a perspective view showing a configuration of a cellular phone (including PHS) as an electronic apparatus equipped with the piezoelectric vibrator.

As shown in FIG. 11, the cellular phone 1200 is provided with a plurality of operation buttons 1202, an ear piece 1204, and a mouthpiece 1206, and a display 1201 is disposed between the operation buttons 1202 and the ear piece 1204.

Such a cellular phone 1200 incorporates either of the piezoelectric vibrators described above (here, the quartz crystal vibrator 1 as an example).

Figure 12:
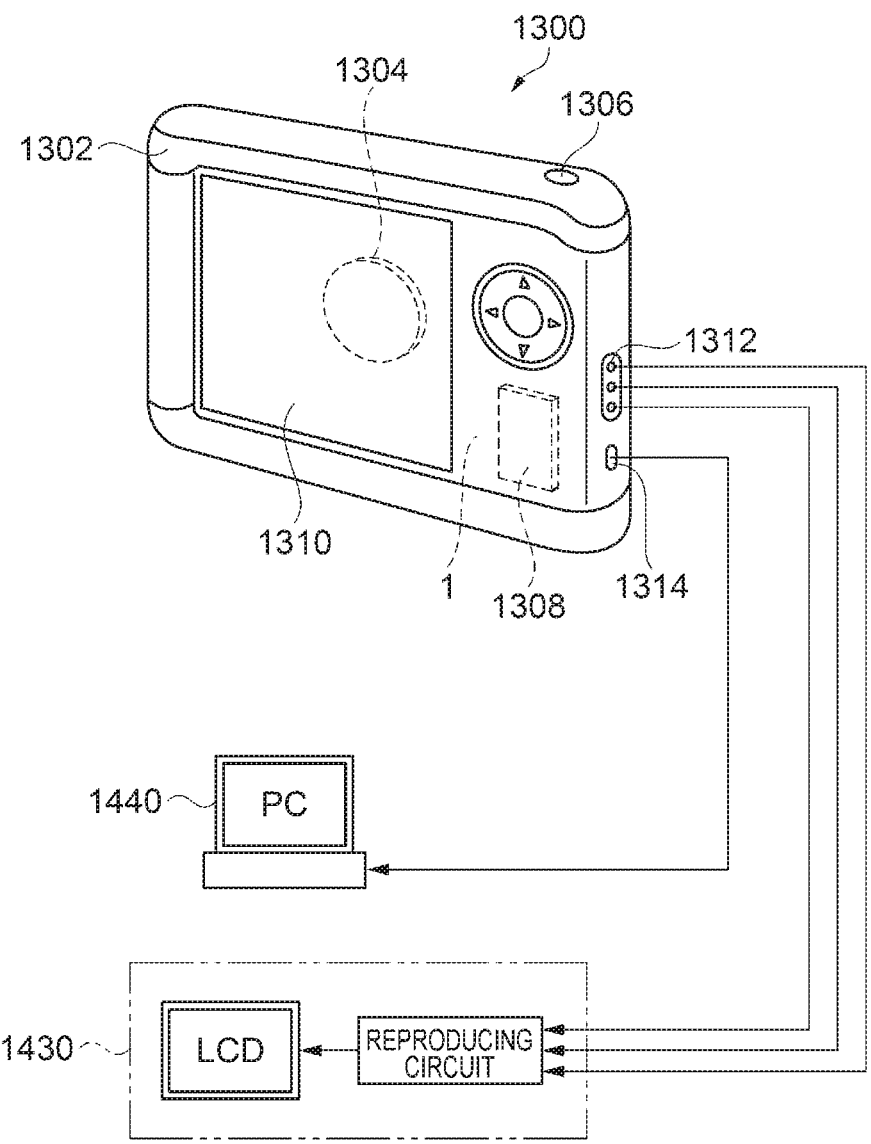
FIG. 12 is a perspective view showing a configuration of a digital camera as an electronic apparatus equipped with the piezoelectric vibrator according to the invention.

FIG. 12 is a perspective view showing a configuration of a digital camera as an electronic apparatus equipped with the piezoelectric vibrator. It should be noted that FIG. 12 also shows briefly the connection to the external equipment.

Here, typical cameras expose silver salt films to optical images of objects, while the digital camera 1300 performs photoelectric conversion on optical images of objects by imaging elements such as CCD (charge coupled device) to generate imaging signals (image signals).

The case (body) 1302 of the digital camera 1300 is provided with a display 1310 disposed on the back surface (on the front side in the drawing) thereof to have a configuration of performing display in accordance with the imaging signal from the CCD, wherein the display 1310 functions as a viewfinder for displaying the objects as electronic images.

Further, the front surface (the back side in the drawing) of the case 1302 is provided with a light receiving unit 1304 including an optical lens (an imaging optical system), the CCD, and so on.

When the photographer checks an object image displayed on the display section 1310, and then holds down a shutter button 1306, the imaging signal from the CCD at that moment is transferred to and stored in a memory device 1308.

Further, the digital camera 1300 is provided with video signal output terminals 1312 and an input/output terminal 1314 for data communication disposed on a side surface of the case 1302. Further, a television monitor 1430 and a personal computer 1440 are connected to the video signal output terminals 1312 and the input-output terminal 1314 for data communication, respectively, according to needs. Further, there is adopted the configuration in which the imaging signal stored in the memory 1308 is output to the television monitor 1430 and the personal computer 1440 in accordance with a predetermined operation.

Such a digital camera 1300 incorporates either of the piezoelectric vibrators described above (here, the quartz crystal vibrator 1 as an example).

Such an electronic apparatus as described above is provided with either one of the piezoelectric vibrators described above, and is therefore provided with the advantages explained in each of the embodiments, and can exert an excellent performance.

It should be noted that, as the electronic apparatus equipped with the piezoelectric vibrator described above, there can be cited in addition to the above, for example, an inkjet ejection device (e.g., an inkjet printer), a laptop personal computer, a television set, a video camera, a video cassette recorder, a variety of types of navigation systems, a pager, a personal digital assistance (including one with communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, various types of measurement instruments, gauges, a flight simulator, a GPS module, network equipment, and broadcasting equipment.

In either of the cases, such an electronic apparatus as described above is provided with either one of the piezoelectric vibrators described above, and is therefore provided with the advantages explained in each of the embodiments, and can exert an excellent performance.

Vehicle

Then, a vehicle equipped with the piezoelectric vibrator described above will be described.

Figure 13:
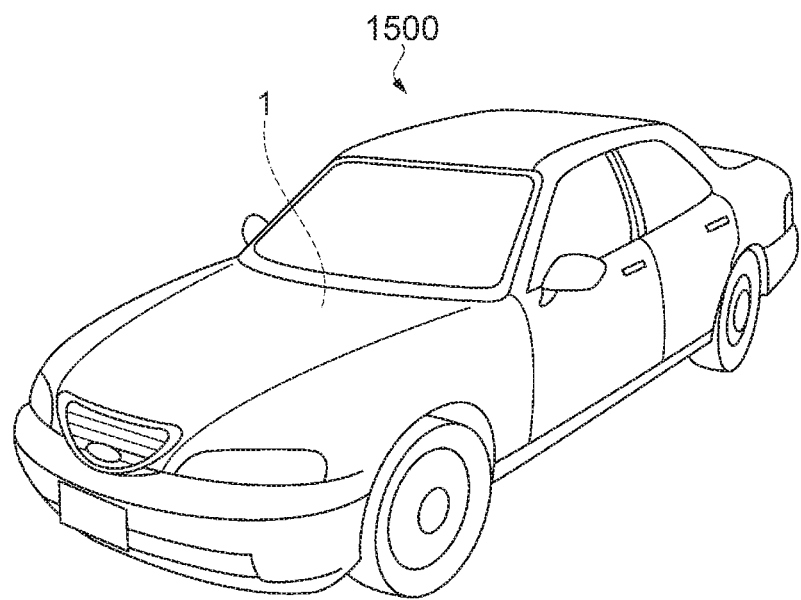
FIG. 13 is a perspective view showing an automobile as a vehicle equipped with the piezoelectric vibrator according to the invention.

FIG. 13 is a perspective view showing an automobile as a vehicle equipped with the piezoelectric vibrator.

The vehicle 1500 shown in FIG. 13 uses either one of the piezoelectric vibrators (here, the quartz crystal vibrator 1 as an example) described above as a timing device for generating the reference clock for a variety of electronically-controlled devices (e.g., an electronically-controlled fuel injection device, an electronically-controlled ABS device, and an electronically-controlled constant-speed running device) installed in the vehicle 1500.

According to the above, the vehicle 1500 is provided with either one of the piezoelectric vibrators described above, and is therefore provided with the advantages explained in each of the embodiments, and can exert an excellent performance.

The piezoelectric vibrators described above can preferably be used as the timing device for the vehicles including, for example, a self-propelled robot, a self-propelled carrying apparatus, a train, a boat and ship, an airplane, and an artificial satellite besides the vehicle 1500 described above, and in either of the cases, there can be provided the advantages explained in each of the embodiments, and thus, it is possible to provide the vehicle exerting an excellent performance.

The embodiments described above are each illustrative only, and the invention is not limited thereto. For example, it is also possible to arbitrarily combine the embodiments described above.

The invention includes configurations (e.g., configurations having the same function, the same way, and the same result, or configurations having the same object and the same advantage) substantially the same as the configuration described as one of the embodiments of the invention described above. Further, the invention includes configurations obtained by replacing a non-essential part of the configuration explained in the above description of the embodiments. Further, the invention includes configurations providing the same functions and the same advantages or configurations capable of achieving the same object as that of the configurations explained in the description of the embodiments. Further, the invention includes configurations obtained by adding a known technology to the configuration explained in the description of the embodiments.

What is claimed is:

1. A piezoelectric vibrator comprising:
a piezoelectric substrate including a first surface, a second surface that is opposite to the first surface, and a connection part that connects the first surface and the second surface to each other; and
a pair of excitation electrodes that are disposed respectively on the first surface and the second surface,
wherein the connection part includes a plurality of protruding parts that are disposed in an area between the excitation electrode and an outer edge of the piezoelectric substrate, and protrude toward the first surface,
top parts of the protruding parts are arranged so that the closer to the outer edge the top part is, the closer to the second surface the top part is, and
lower parts of the protruding parts that connect the adjacent protruding parts to each other are arranged so that the closer to the outer edge the lower part is, the closer to the second surface the lower part is.

2. The piezoelectric vibrator according to claim 1, wherein
the protruding part has a width on the top part narrower than a width on the lower part in a cross-section along a direction connecting the excitation electrode and the outer edge to each other.

3. The piezoelectric vibrator according to claim 2, wherein
the protruding part has a spine-like shape in which a thickness on the top part is thinner than a thickness on the lower part.

4. The piezoelectric vibrator according to claim 1, wherein
a thickness of the piezoelectric substrate decreases from closest one of the protruding parts to the outer edge toward the outer edge.

5. The piezoelectric vibrator according to claim 1, further comprising:
an extraction electrode that is connected to the excitation electrode and covers at least a part of the plurality of protruding parts.

6. The piezoelectric vibrator according to claim 1, further comprising:
a base substrate on which the piezoelectric substrate is mounted,
wherein the extraction electrode and the base substrate are fixed with an electrically-conductive adhesive.

7. The piezoelectric vibrator according to claim 1, wherein
the connection part further includes a plurality of second protruding parts that are disposed in the area between the excitation electrode and the outer edge of the piezoelectric substrate, and the plurality of second protruding parts protrude toward the second surface.

8. The piezoelectric vibrator according to claim 7, wherein
top parts of the second protruding parts protrude toward the second surface are arranged so that the closer to the outer edge the top part is, the closer to the first surface the top part is, and
lower parts of the second protruding parts protrude toward the second surface that connect the adjacent protruding parts to each other are arranged so that the closer to the outer edge the lower part is, the closer to the first surface the lower part is.

9. An electronic apparatus comprising:
the piezoelectric vibrator according to claim 1.

10. A vehicle comprising:
the piezoelectric vibrator according to claim 1.

* * * * *